United States Patent [19]
Macovski

[11] Patent Number: 5,057,776
[45] Date of Patent: Oct. 15, 1991

[54] PULSED FIELD MRI SYSTEM WITH NON-RESONANT EXCITATION

[76] Inventor: Albert Macovski, 2505 Alpine Rd., Menlo Park, Calif. 94025

[21] Appl. No.: 447,800

[22] Filed: Dec. 8, 1989

[51] Int. Cl.$^5$ ............................................. G01R 33/20
[52] U.S. Cl. ..................................................... 324/309
[58] Field of Search ............... 324/300, 307, 309, 310, 324/311, 312, 313, 314, 318, 322; 128/653

[56] References Cited

U.S. PATENT DOCUMENTS 3,714,551  1/1973  Pajak et al. ....................... 324/313
3,774,103  11/1973  Laukien ............................. 324/313

Primary Examiner—Michael J. Tokar

[57] ABSTRACT

A pulsed strong magnetic field is applied to an object creating a magnetic moment distribution. Following the pulse a set of spatially orthogonal gradient fields pointed normal to the magnetic moments are used to cause the magnetic moments to precess around the axis of the gradient fields, producing time-varying magnetic fields indicative of the spatial distribution of the magnetic moments. These are then detected, processed and used to make magnetic resonance images of the object.

55 Claims, 8 Drawing Sheets

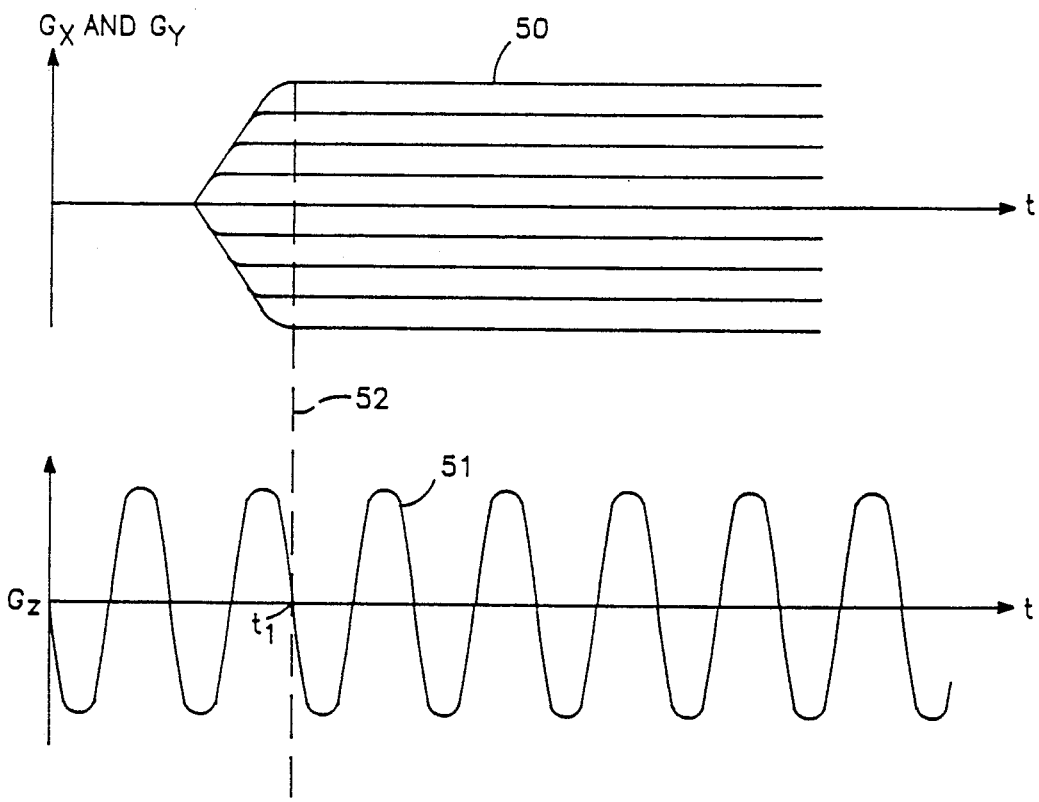
FIG.−6
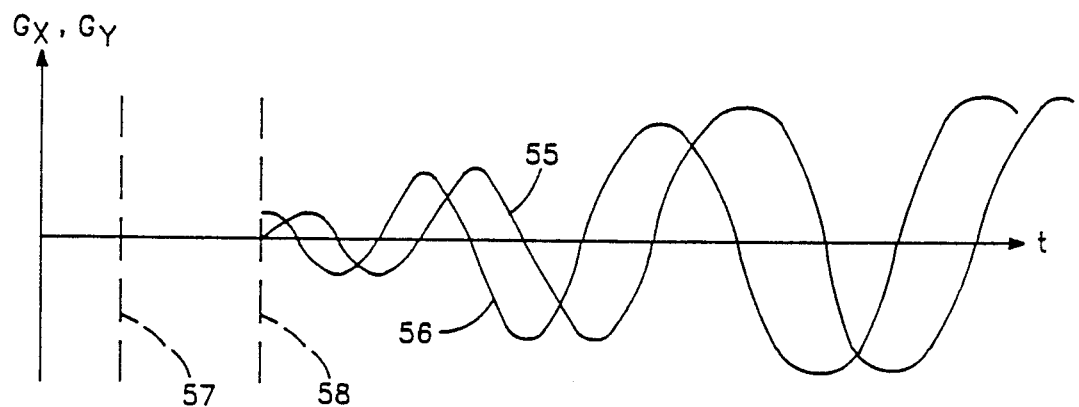
FIG.−7

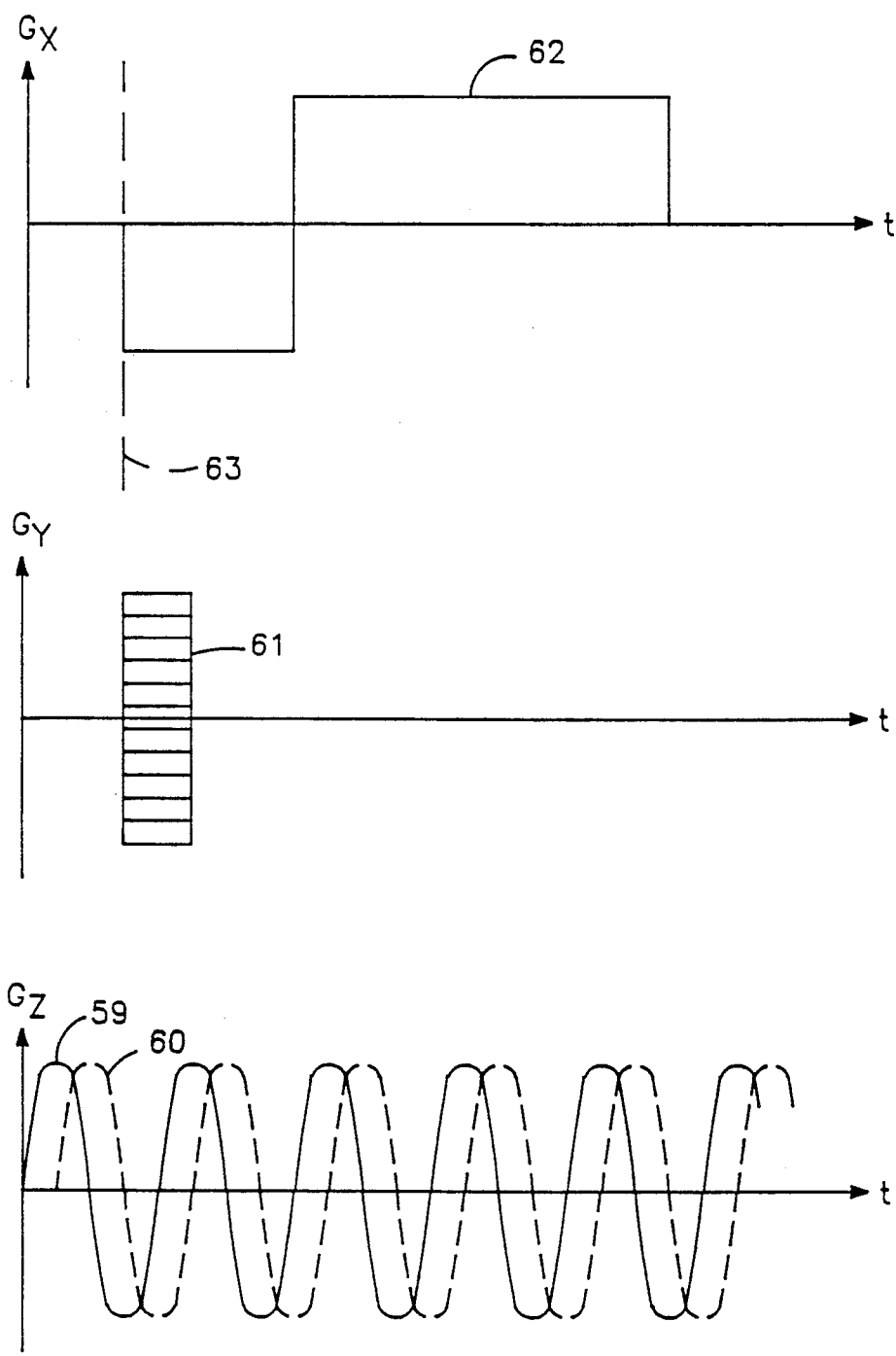
FIG.—8

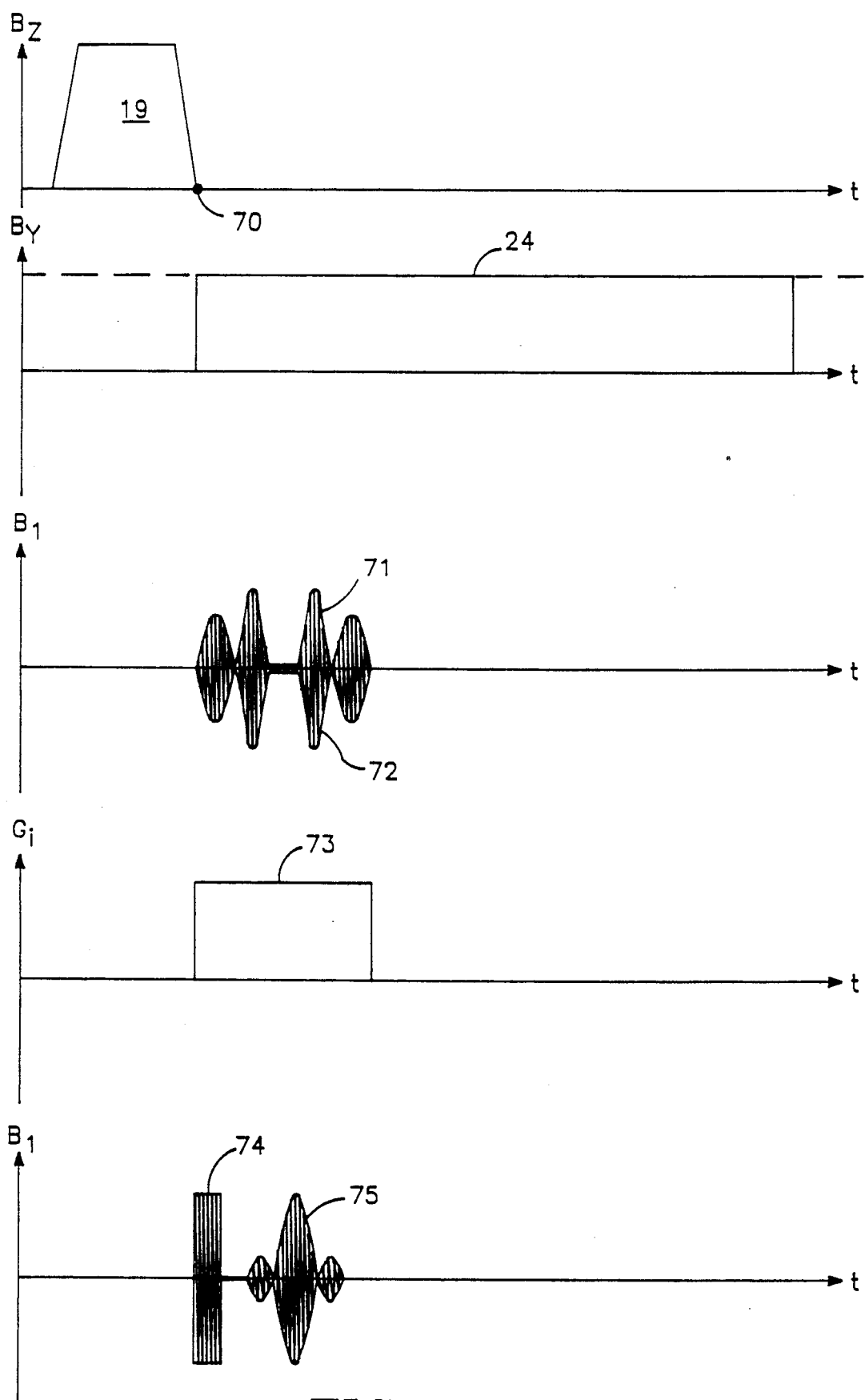
FIG.—9

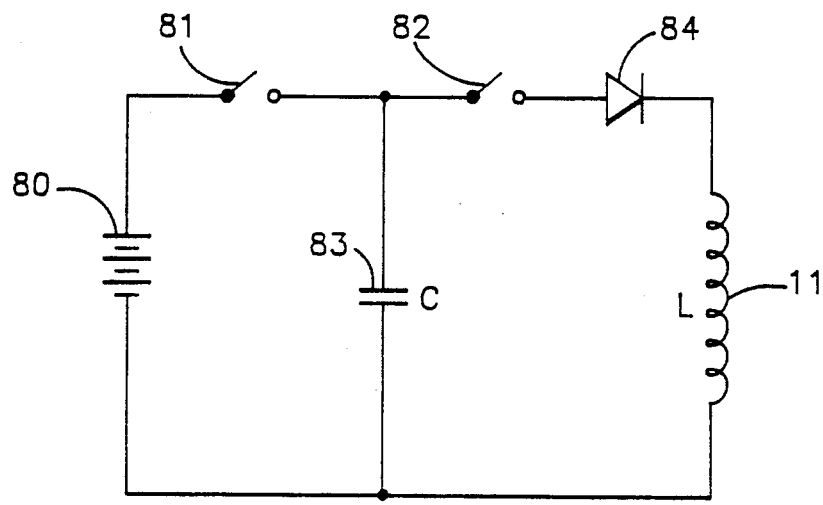
FIG.—10
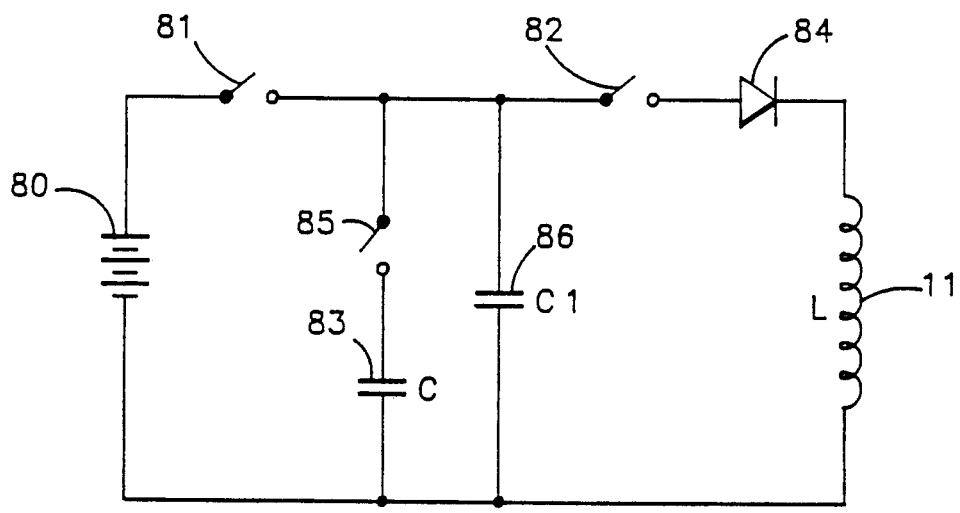
FIG.—11

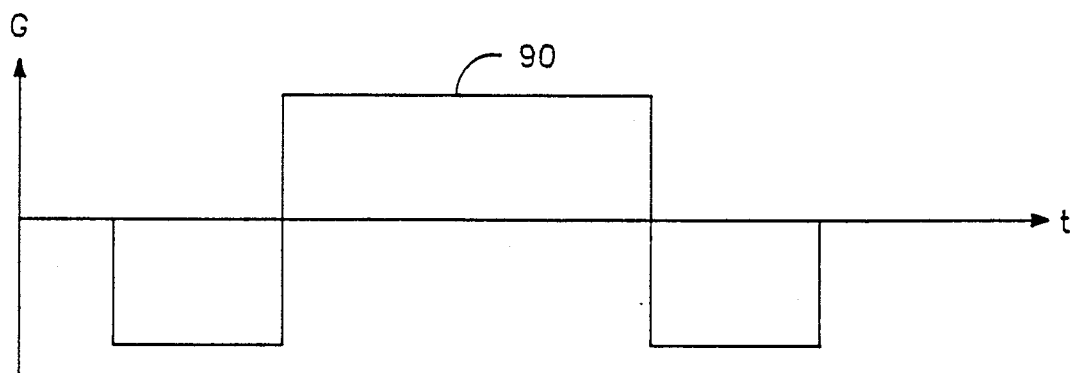
FIG.—12A
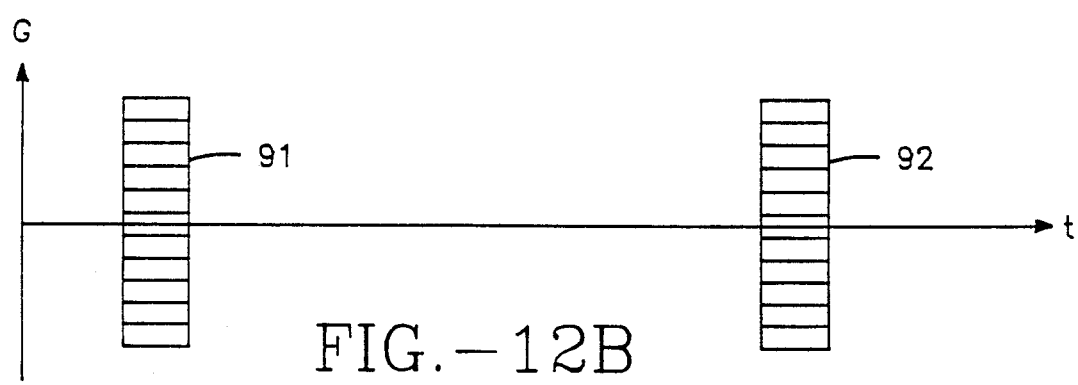
FIG.—12B
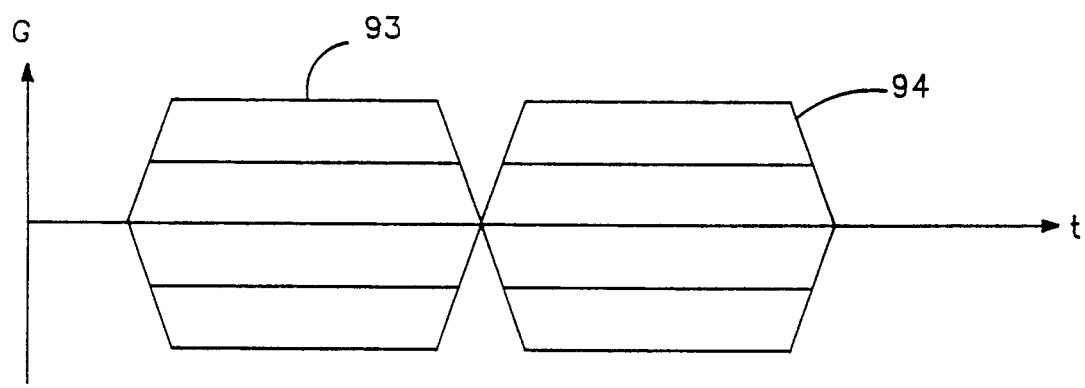
FIG.—12C
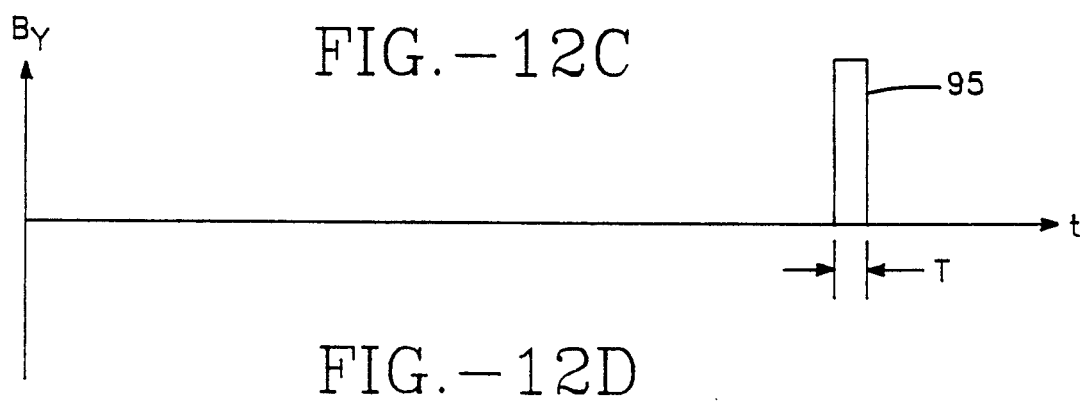
FIG.—12D

5,057,776

PULSED FIELD MRI SYSTEM WITH NON-RESONANT EXCITATION

BACKGROUND OF THE INVENTION

1. Field of the Invention

This invention relates primarily to magnetic resonance imaging systems. In a primary application this invention relates to the use of a pulsed polarizing field where resonance plays no role, and the use of gradients during the readout interval where the added field is small or zero.

2. Description of Prior Art

Magnetic Resonance Imaging has become one of the wider-used modalities in the field of medical imaging. A descriptive series of papers on NMR imaging appeared in the June 1980 series of the IEEE Transactions on Nuclear Science, Vol. NS-27, pp1220-1255. The basic concepts are covered in the lead article, "Introduction to the Principles of NMR" by W. V. House, pp. 1220-1226.

In general, in a MRI imaging system, the object being studied is within a highly-uniform intense static magnetic field. The object is then excited by a high-power radio frequency burst which causes the magnetic moments in the object, which were lined up with the static field, to precess normal to the static field. Using spatially orthogonal gradients, these magnetic moments become spatially varying. A receiver coil picks up the signals from the precessing moments. This signal is processed to create images of the magnetic moment density in the object.

These systems have a large number of theoretical and practical problems. The resulting costs are quite high since a highly uniform magnet is required over a relatively large volume. Also, a high-power radio frequency transmitter is required which must be uniformly distributed over the object and must avoid any excessive heating effects. Anything in the object which modifies the magnetic field, such as materials within the body which have changes in magnetic susceptibility, especially metal implants, can seriously distort the image or make imaging impossible. Slightly differing magnetic resonances from different materials, primarily water and fat, become translated from each other, distorting the image. Also, many solid materials cannot be imaged since, in the presence of a strong polarizing field, the take on very short decay times. MRI machines cause loud sounds when the gradient coils are excited in the presence of a static magnetic field. Another practical difficulty with existing instruments is that high-power wide-bandwidth amplifiers are required to run the gradient coils.

Efforts at increasing the SNR (signal-to-noise ratio) of NMR images usually involve increasing the magnetic field strength. However, in existing systems this ability is quite limited. If the field is increased, the r.f. excitation frequency must also be increased, greatly aggravating the r.f. heating problem. Also, the penetration of the r.f. signal on both the transmit and receive modes becomes a serious problem.

Perhaps the most important of the economics is that MRI, despite its almost ideal lack of toxicity and radiation, is not used for mass screening for any disease because of the prohibitive costs involved. One attempt at a simpler system is given in a paper by J. Stepisnik, M. Kos, and V. Erzen in Proc. of XXII Congress Ampere, Roma, 512, 1986. Here the magnetic field is pulsed and then the magnetic moments are allowed to line up in the earth's field. Following this, an r.f. excitation is used to rotate the moments, with a set of gradients in the same direction as the earth's field used to create an image. This system has marginal performance, given the very weak gradients, and limited economic advantage, since r.f. excitation is required. A non-imaging system, without any r.f. excitation, was used to measure the earth's field using NMR. This system is described in Phys. Rev., A94, 941, (1954). Here a water sample is subjected to a pulsed field normal to the earth's field. The pulse is shaped so that the magnetic moments remain in the direction of the pulsed field when it turns off. Following the pulse, the precession frequency due to the earth's field is measured to determine the earth's field. This system used no gradients and did not provide imaging.

SUMMARY OF THE INVENTION

An object of this invention is to produce NMR images of an object, such as the body, with immunity to variations in the magnetic fields.

A further object of this invention is to produce NMR images of the body without requiring radio frequency excitation.

A further object of this invention is to avoid the distorting effects of materials with magnetic susceptibility.

A further object of this invention is to avoid the loud sounds caused by gradient coils.

A further object of this invention is to enable the imaging of solid materials.

A further object of this invention is to enable the use of stronger magnetic fields, for improved images, without the heating and penetration problems.

Briefly, in accordance with the invention, a pulsed magnetic field is applied to an object, leaving the magnetic moments pointed in a first direction. Spatially orthogonal magnetic gradients are applied each having their magnetic fields pointed normal to the first direction, causing the magnetic moments to precess about the gradient fields. This precession is spatially varying. The resultant time-varying fields are detected and processed to provide an image of the moment density in the object.

BRIEF DESCRIPTION OF THE DRAWINGS

For a more complete description of the invention, reference can be made to the following detailed description of several illustrative embodiments thereof which is given in conjunction with the accompanying drawings, of which:

FIGS. 5, 6, 7, and 8 are graphs of alternate embodiments of gradient waveforms used in the invention;

FIG. 9 illustrates graphs of waveforms used in an alternate embodiment of the invention;

FIG. 10 is a schematic diagram of a pulse generator for an embodiment of the invention;

FIG. 11 is a schematic diagram of an alternate embodiment of a pulse generator; and FIGS. 12 *a-d* are waveforms used in an alternate embodiment of the invention.

DESCRIPTION OF THE PREFERRED EMBODIMENT

Figure 1:
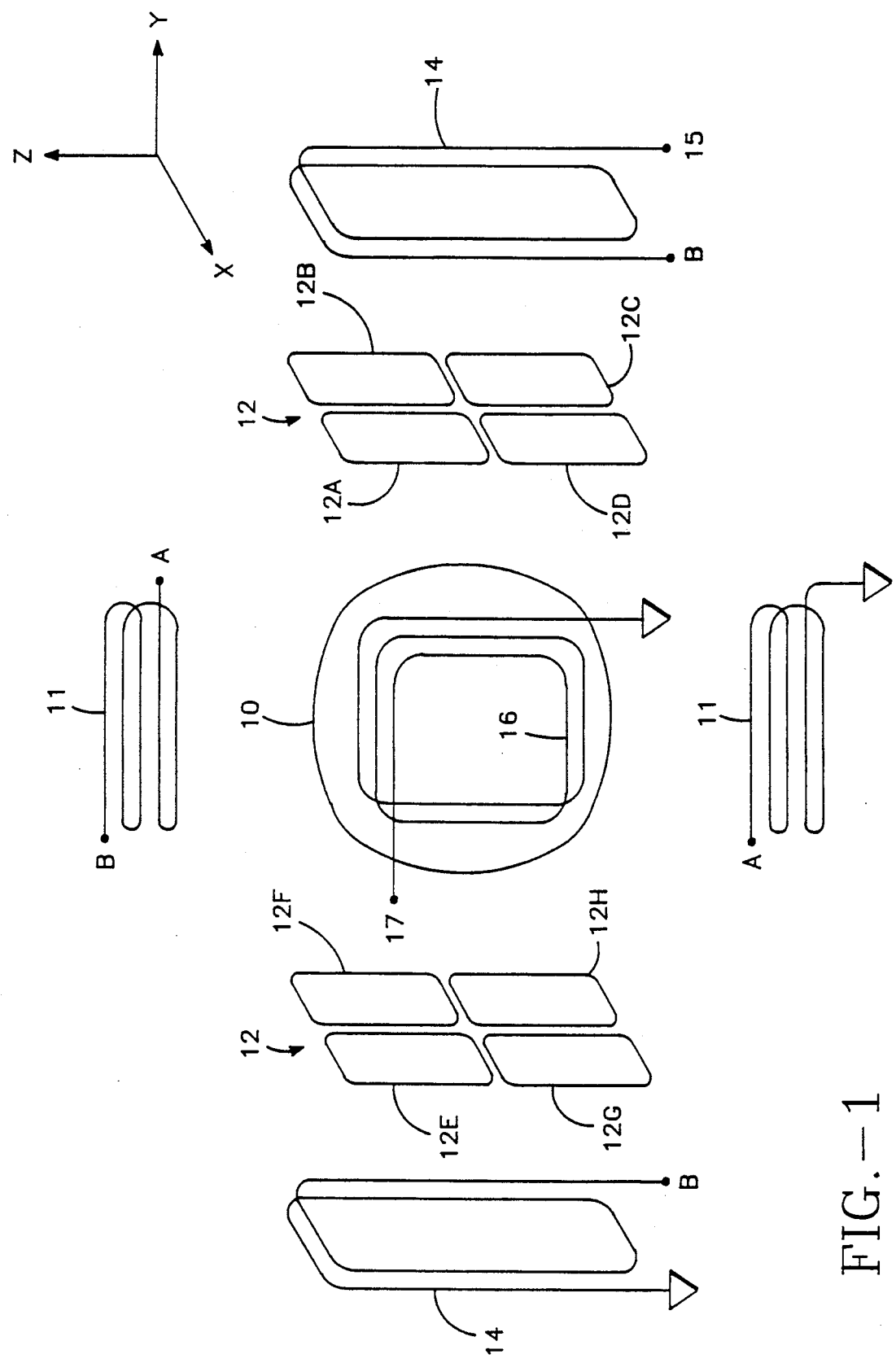
FIG. 1 is a schematic drawing illustrating an embodiment of the invention.

An understanding of the broad aspects of the invention may best be had by reference to FIG. 1. Here it is desired to create a magnetic resonance image of object 10, which is often a portion of the human body. In most MRI (magnetic resonance imaging) systems the object 10 would be immersed within an ultra-uniform static magnetic field, and have r.f. coils for the excitation of the magnetic moments. These expensive and critical components are not used in this invention. A pulsed magnetic field is used to polarize the magnetic moments in 10 by applying a current pulse to coils 11 where the upper and lower portion of coils 11 are series aiding, where terminals A are connected. This current pulse 19 is illustrated as the top graph in FIG. 2. This polarizing pulse replaces the large static $B_0$ field used in all existing MRI systems. Since this pulsed field is not present during the time signals are received, no critical resonance issues are involved. The details of the pulse will subsequently be described. Following the pulse, the magnetic moments in 10 are polarized in the z direction. Following the pulse, gradient fields from gradient coils 12 create fields normal to the polarized moments, causing them to precess at frequencies determined by their relative positions in the spatially varying gradient fields. These precessing moments are received by receiver coil 16 and processed to provide an image of object 10. Thus the received signal 17 from coil 16 is received during the time the gradient signals are turned on between polarizing pulses 19.

Figure 2:
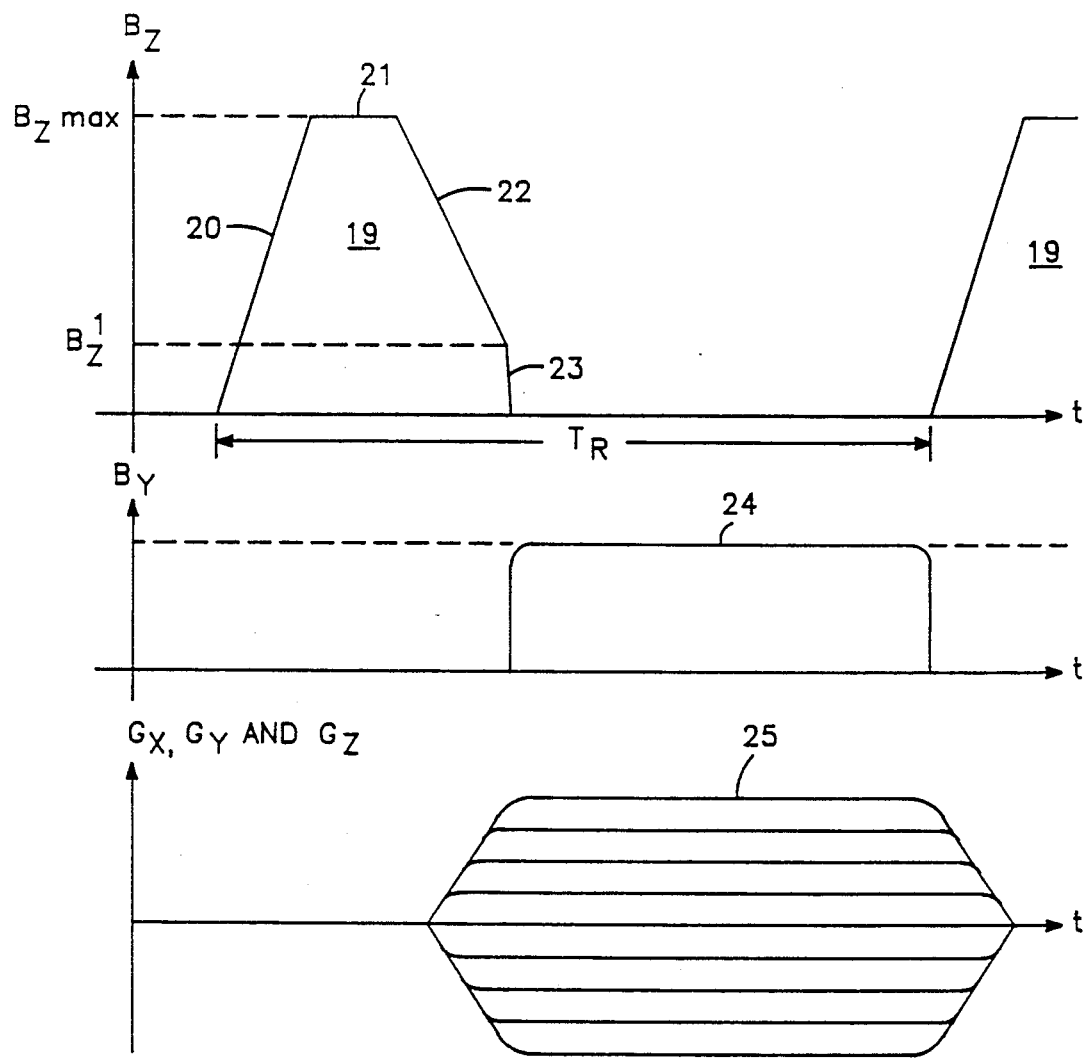
FIG. 2 is a set of graphs of signals used in an embodiment of the invention.

Referring to FIG. 2, the sequence is begun by creating the pulsed field 19 in 13, shown as $B_z$ in the top graph. The magnetic field is first increased, as shown in segment 20. The rate of increase dB/dt is governed by a number of practical factors. These include the peak voltage across coil 13 and the maximum dB/dt to avoid inducing excessive neural currents, which is about 10-100 Tesla/second. Neural currents are induced in the human nervous system by rapidly changing fields and have been found to cause apparent light flashes and muscle twitching. The peak value $B_z$ max, shown as 21, will determine the intensity of the magnetic moments, and therefore the resultant SNR. The duration of the pulse will partially determine the sensitivity of the resulting image to the $T_1$ recovery time, since longer $T_1$ species will reach a smaller fraction of their maximum value. The $T_1$ sensitivity will also be determined by the steady state values reached by a succesion of pulses separated by period $T_R$ as shown.

The more important region is the decay shown as segments 22 and 23. What is desired is that the magnetic moments point in the z direction until the gradients are applied, resulting in precession. If we assume no other fields present, this happens automatically. However, a variety of other fields can be present, including the earth's magnetic field. More important, it is convenient to start some of the other fields, including $B_Y$ and the gradient fields shown in FIG. 2, before the main pulse 19 ends. In this way they can be allowed to change slowly, or be on almost all the time, reducing the bandwidth and power requirements of the amplifiers and enabling the use of coils with relatively large numbers of turns, reducing the current requirements.

To accomplish these aims first the pulse amplitude is reduced adiabatically, where $dB/dt << \gamma B^2$ where $\gamma$ is the gyromagnetic ratio. This requirement, which is not critical, insures that the moments remain pointed in the direction of the net field, in this case the z direction. This adiabatic decay continues until the field $B'_z$ is reached, a value substantially larger than the transverse magnetic field. The particular value used will depend on the transverse fields $B_Y$ and the gradients which are on before pulse 19 terminates. From $B'_z$ on the pulse is made to drop non-adiabatically, where $dB/dt >> \gamma B^2$. This insures that the moments remain pointed in the z direction and don't turn substantially in the direction of the transverse fields, but precess about them. As indicated, these requirements are not critical, and depend on the transverse fields present. If the time of segment 23 is short compared to $1/\gamma B'_z$, the moments will remain pointed in the z direction.

In one embodiment, a static transverse field $B_Y$, shown as 24, is used in addition to the gradients. This field can be provided by the coils 14 in FIG. 1 where terminals B are connected to provide a series aiding configuration. These two coils on opposite sides of object 10 will provide a reasonably uniform field within the object. Thus signal 24 is connected to terminal 15 to energize coils 14. As shown in FIG. 2, signal 24 can either be a constant, as shown in the dotted lines, or be a pulse which is turned on after pulse 19 ends and is turned off following the collection of data during the gradient sequence. If it is always left on, it makes pulse 19 somewhat more complex in that $B'_z$ is higher and the requirement for segment 23 to rapidly decay is somewhat more critical in insuring that the magnetic moments remain in the z direction. If it is pulsed, as shown in the solid line, it can be originated after pulse 19 ends. However, this requires a pulsing circuit, which can be more expensive. An alternative to coils 14 is to derive the field $B_y$ using the same coils 12 as will be used for the gradient signals. Coil array 12 enables control of the gradients in all dimensions, as will be shown. However, if all eight coils are driven with the same signal, a reasonably uniform $B_Y$ field will be produced, eliminating the need for coils 14.

The purpose of the spatially uniform $B_Y$ field is to place all of the image information on a low-frequency carrier having a frequency $\gamma B_Y$. This facilitates the demodulation of the image information. It also avoids the extremely low frequencies which might cause noise problems because of 60 hz power fields and the 1/f noise in active devices. This field is sufficiently low such that typical inhomogenieties in the field will not cause problems. In general the minimum amplitude of $B_Y$ must exceed the largest field due to the gradients, which is $G_{max}X_{max}$, the product of the largest gradient and the largest dimension of the object from the center. Typical values are about 0.5 gauss/cm for the maximum gradient and 15 cm as the maximum distance for a field of about 7.5 gauss. Using a $B_Y$ of 10 gauss, this represents a carrier frequency of about 40 khz. The image signals will be distributed about this carrier frequency.

The gradient requirements are essentially the same as a conventional MRI system using rf excitation. Thus a conventional gradient configuration can be used, with all of the fields, instead of being pointed in the direction of the $B_0$ field, are orthogonal to the pulsed polarizing field. As an illustrative embodiment of gradient fields coil configuration 12 contains 8 coils, each having individually controllable currents. These coils each produce fields in the y direction and can be driven such as to provide variations in each of the three axes. Referring to the letters on coils 12, driving coils A, B, C, and D with one current polarity and coils E, F, G, and H with the other polarity will produce a variation along y or a $G_Y$ gradient. Similarly, driving A, B, E, and F with one polarity and C, D, G, and H with the other will provide a $G_Z$ gradient. Finally driving coils A, D, E, and G with one polarity and F, H, B, and C with the other will provide a $G_X$ gradient. In those cases where more than one gradient signal is on at a time, the currents to each coil merely add. As with conventional gradient systems these fields produce:

$G_X = dB_Y/dx$
$G_Y = dB_Y/dy$
$G_Z = dB_Y/dz$ all pointed in the y direction. As with conventional MRI systems, these gradients represent a temporal scan through k-space where:

$$k_X(t) = \gamma \int G_X(t) dt$$

with the same formulation for $k_Y$ and $k_Z$ respectively. FIG. 2 shows one gradient embodiment where the 3D k-space is filled with an array of radial lines. For each value of one gradient, the other two go through all possible values. From the equation above we see that a constant gradient results in a radial scan of k space in a direction determined by the relative amplitudes of the three gradients. Thus, with one gradient on, $G_x$, $G_Y$, or $G_z$, we provide radial lines along the $k_x$, $k_Y$, or $k_z$ axes. Using arrays of combinations of intermediate values of the three gradients, as shown in FIG. 2, we can provide radial lines in any direction in k space. In this way the entire sphere of 3D k-space is sampled by the array of radial lines. The 3D object points can then be extracted by inverse Fourier transformation, or by projection reconstruction techniques, all well known. This is described by P. Lauterbur in Nature (London), 242, 190,(1973). As shown in FIG. 2, the gradient waveforms begin before pulse 19 ends. This simplifies the generation of these waveforms since they can have very slow rise-times corresponding to narrow bandwidths. This does, however, increase the burden on the pulse waveshape since the pulse must rapidly decay, in segment 23, for values representing the maximum gradient value plus the constant $B_Y$, if used. If this represents a practical difficulty, the gradients can be initiated following the end of pulse 19, requiring more rapid gradients as are presently used. The entire sequence is repeated, using the appropriate gradients, at intervals $T_R$ as shown in FIG. 2.

Figure 3:
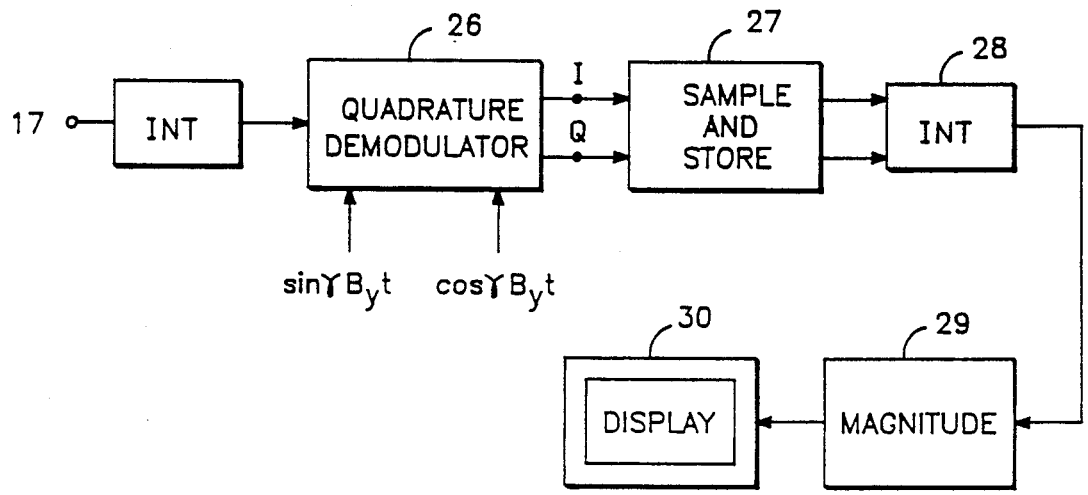
FIG. 3 is a schematic drawing of the receiver and processor functions in an embodiment of the invention.

The receiver system is illustrated in FIG. 3. It begins with the pickup of the signals from object 10 in the presence of the gradients. The magnetic moments precess about the y axis, so that any coil having an axis normal to the y axis will receive the signal. For illustrative purposes, coil 16 is shown, having its axis in the x direction, receiving signals from the precessing moments in 10, with the signals from the total volume appearing at terminal 17. Coil 16 can represent either a classic array of N turns, with a signal N d$\phi$/dt, or can represent the coil of a SQUID detector or a Hall Effect detector where signal 17 is proportional to the flux $\phi$, rather than its derivative. If a conventional coil is used, because of the derivative operation, the resultant spectrum should be corrected. This can be accomplished by integrator 32, which can simply be an RC filter or more complex filter which results in an amplitude response inversely proportional to frequency in the vicinity of $\gamma B_Y$, the center frequency. If direct flux detectors, such as SQUIDS or Hall Effect devices are used, integrator 32 is eliminated.

In any case the signal entering the quadrature demodulator, 26 will be a classic modulated carrier as given by:

$$S(t) = \int m(r) \exp(i\gamma B_Y) \exp(ik(t) \cdot r) dr$$

This signal is then quadrature demodulated in 26 producing two baseband signals I and Q, representing the real and imaginary part of k-space, or the spatial transform of the object 10. This is then sampled in 27, and stored based on the sequence used to scan k-space. The k-space values are then transformed in 28 to provide complex image signal 31. To display various aspects of the 3D image, it is convenient to take magnitude values in 29. Display 30 is used to display any cross section or projection of the 3D image values.

In addition to coil 16 being used for receiving the precessing moment signal, the pulser coils 11 can be used for receiving following the pulse since coils 11 are also in quadrature with the gradient fields. A switch can be used, as in switch 40 in FIG. 4, to first apply the pulse to coils 11 via terminal 13 by connecting the arm of switch 40 to position 42. Following the pulse, the switch is thrown to position 41, providing signal 43 which can be connected to the system of FIG. 3 by applying 43 to integrator 32. In this way a single coil is used for both pulsing and receiving. It should be noted that only a portion of FIG. 4, namely the switch, is used in this function.

For improved SNR, both coils 11 and 16 can be used together by combining signals 17 and 43 in a 90° phase shift network. This is done in existing MRI systems and is not shown in the Figures.

The system shown thusfar has placed the image information on a very low frequency carrier through the use of field $B_y$ added to the symmetrical gradient fields. This field is sufficiently low that it will not cause any significant chemical shift due to lipids, etc. or any distortion due to magnetic susceptibility variations in the body. Also, since the field is very low, a significant degree of inhomogeniety in this field can be tolerated. If homogeniety in this field plus non-linearity in the gradient fields, causes any spatial distortion, it can be pre-corrected by one of many well known methods. Since these errors are fixed, and not altered by magnetic variations in object 10, they will remain stable.

Figure 4:
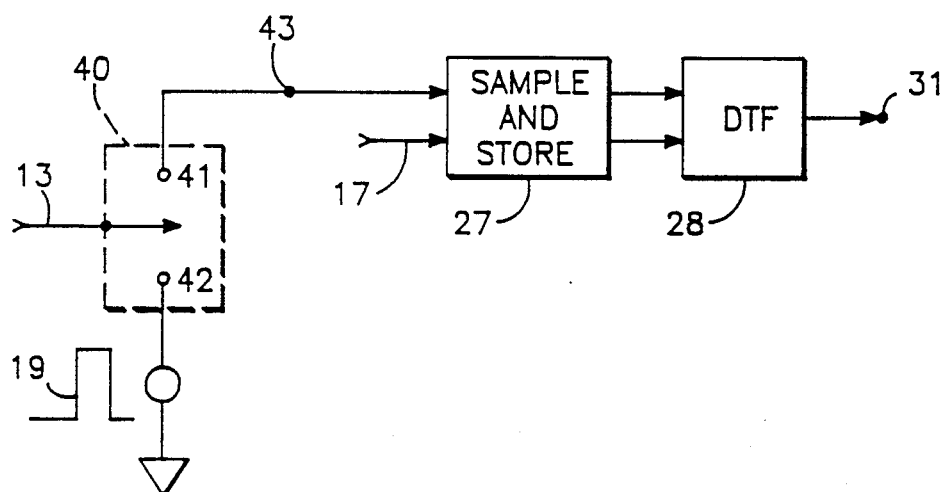
FIG. 4 is a schematic drawing of an embodiment of the invention using quadrature receiver coils.

Alternatively, the system can be configured with $B_Y$, signal 24, equal to zero. Here the gradient fields result in a baseband signal from the precessing moments. In order to receive this complex signal, we must use both quadrature receiving signals 43 and 17 as shown in FIG. 4. These represent the real and imaginary parts of the k-space of object 10, acquired in a sequence determined by the gradient waveforms. These signals are sampled and stored in 27. The discrete Fourier transform is taken in 28, providing a sequential image signal 31. Here the quadrature receiving systems are required, rather than being used for enhanced SNR as in the system with a $B_Y$ carrier. The baseband system operates at the lowest possible frequencies, which can be an advantage where body losses are involved. These are nominally proportional to the square of frequency. However, the use of baseband may make it more difficult to eliminate other noise sources such as 60 hz power fields and 1/f noise an active devices.

The receiver coils can again be $\phi$ detectors, such as squids, or $d\phi/dt$ detectors. In the latter case compensation for the frequency weighting must be used. Obviously the d.c. and very low frequencies are eliminated and must be restored by the methods previously referred to.

Figure 5:
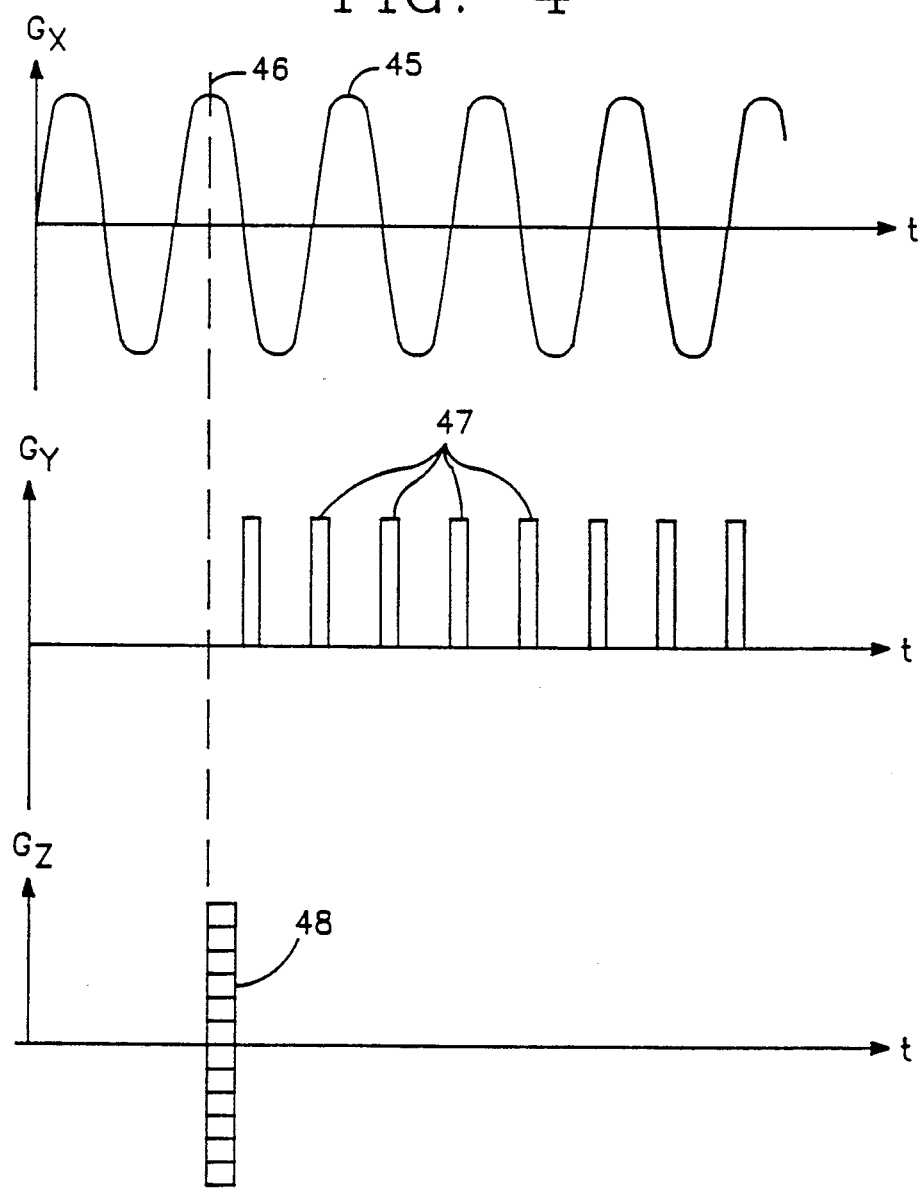

FIGS. 5, 6, and 7 are alternative gradient embodiments. As shown, as with FIG. 2, they represent k-space scanning over three dimensions. Three-dimensional scanning of k-space provides a considerable SNR advantage since signal is accumulated from each voxel for the entire imaging time. FIG. 5 shows one alternative using an echo-planar system. This system is described in the book "NMR Imaging in Biomedicine" by P. Mansfield and P. G. Morris, Academic Press, pp.143–154. $G_X$ is a sinusoid 45 providing an oscillatory scan along the $k_X$ axis. Sinusoidal scans are desirable since resonant gradients can be used, as described in U.S. Pat. No. 4,639,671 by the same inventor, issued Jan. 27, 1987. The sinusoidal scan is initiated at time 46 when pulse 19 terminates. Following each traverse of the kx axis a short pulse or blip, 47, is applies which advances one unit in $k_Y$, providing a raster scan of the $k_X$—$k_Y$ plane as is well known in echo planar systems. To cover all of k-space, a phase-encoding pulse is applied to $G_Z$ to step an increasing distance in $K_Z$ following each traverse of the $k_X$—$k_Y$ plane. This approach is much faster than that of FIG. 2 since the entire $k_X$—$k_Y$ plane is covered in each pulse excitation. Thus for N steps in $k_Z$, the entire volume is covered in N pulses.

In FIG. 6 the $k_X$—$k_Y$ axes are covered as in FIG. 2 with radial lines in k space resulting from constant gradients 50. The $k_Z$ axis is scanned using sinusoid 51, which can be resonant for efficiency reasons. As with FIG. 5, the sinusoid can be started well before k-space scanning begins, or can be left on constantly, enabling the use of high Q resonant circuits. This system is as fast as that of FIG. 5 in that a plane in k-space, parallel to and intersecting the $k_Z$ axis, is covered during each excitation. As shown, the initiation of the k-space scan, 52, corresponding with the end of pulse 19, is timed to occur during a zero of $G_Z$. This reduces the requirements on the amplitude of Bz in FIG. 1 since, at the time pulse 19 is turning off, the transverse fields will be reduced. An additional version of gradient waveforms is shown in FIG. 7. Here, pulse 19 ends at time 57, creating the precessing moments in object 10, but the scan of k-space isn't initiated until time 58. This can be done with any of the gradient systems described and provides image sensitivity to the $T_2$ relaxation parameter, which is known to be significant in images of the body. It is interesting to note that, with this system, it is not required to use the re-focusing properties of spin echoes. Merely waiting, or using gradient echoes is all that is required since inhomogeniety and chemical shift will not attenuate the precessing moment amplitude. The waveforms shown in FIG. 7 will produce a spiral scan in the $k_X$—$k_Y$ dimension in k-space. The waveforms are in quadrature phase. For the $k_Z$ axis, not shown in FIG. 7, we can use the phase encoding steps of FIG. 5, or the sinusoid of FIG. 6.

FIG. 8 is an alternate gradient configuration where the $k_X$—$k_Y$ scan is identical to the 2DFT system in wide use in present systems. The sequence begins at time 63 when pulse 19 ends. Here different phase encoding steps 61 are applied to $G_Y$ while $G_X$ goes first negative, thus moving to the most negative $k_X$ value, and then positive to scan the kx values while data is collected. Thus in the center of the positive portion of waveshape 62, the $k_X=0$ region will be traversed. This point will therefore determine the $T_2$ sensitivity of the image. For coverage of $k_Z$, a sinusoid is shown. This can be a sinusoid whose frequency is at the sampling rate of the $k_X$ scan as in FIG. 6. This would be relatively high, requiring a relatively high amplitude. The frequency and power requirements can be reduced by using an interleaved system, where relatively course sampling is used on any one scan. This is followed by a sequence of identical scans where the sampling positions are moved, so as to sample the entire k-space. As shown in FIG. 8, $k_Z$ waveform 59 is used on one scan, and 60 on another scan to fill in the samples in k-space. This same general approach can be used an any of the other gradient waveforms. The gradient requirements are reduced at the expense of a longer scanning interval.

It should be emphasized that this invention greatly enables the use of rapid scanning of k-space. In conventional systems, the time of a scan is limited by two phenomena. Firstly, the intravoxel inhomogeniety results in relatively rapid decay of the signal, limiting the acquisition time following each excitation. Secondly, the chemical shift for different species, such as lipids, and the susceptibility shifts due to air pockets etc. Both result in significant phase errors for relatively long acquisitions. All of these problems are essentially non existent in this pulsed approach since the main polarizing field is absent during data acquisition.

The gradient systems shown are for scanning through the entire three-dimensional k-space. However, if two of the three gradient waveforms are used, with the third zero, information will be acquired representing a projection, through object 10, in the direction of the unused gradient. These images, comparable to conventional x-ray projection images, can be acquired in a much shorter time interval. Their disadvantage is that projection images have intervening structures which often obscure the structures of interest. This problem is overcome through the use of selective projection imaging which provides only the materials or structures of interest. One excellent example and application of selective projection imaging is vessel imaging where static material is canceled and the resultant projection represents solely the moving blood. This concept was introduced in U.S. Pat. No. 4,528,985 by the same inventor. One approach which can be used is to provide two sets of excitations having identical k-space scans. On one, however, the gradient signal, prior to data collection, has a first moment different from that of the other, while their zeroth moments are identical. Thus when the two images are subtracted, the static tissue is canceled and the flowing blood in vessels is visualized as an angiogram. Another approach is to subtract two identical sequences which are timed to occur at different phases of the cardiac cycle, representing differing flow velocities. A general overview of these approaches is given in a paper entitled, "Magnetic Resonance Angiography" by D. Nishimura et al, IEEE Transactions on Medical Imaging, MI-5, September 1986, pp 140-151. Many of the methods in this paper can be used to provide projection vessel images in this system. In addition to projection imaging of blood vessels, projections can be made to isolate other materials of interest by combining sets of image data representing different parameters such as $T_1$ and $T_2$. This process is described in U.S. Pat. No.

4,486,708 "Selective Material Projection Imaging System Using NMR" by the same inventor.

In addition to 3D images, and selective projection images, there is interest in making 2D images of a plane or thin section. It is difficult to achieve a sectional image by confining the pulsed field from coils eleven to a narrow section. One approach to planar selection is to selectively undo the precessing moments from all portions of the volume except the plane of interest as illustrated in FIG. 9. Here, following polarizing pulse 19, we use the previously described $B_Y$ bias 24 to place the information on a relatively low frequency carrier. As indicated earlier, this bias field can be on constantly, as in the dashed line, or be turned on following pulse 19, as in the solid line. Prior to acquiring data, slice selectivity can be used. As shown in the first $B_1$ waveform, 71, the object is excited such that all moments, other than the slice or section of interest, are rotated into the y axis thus ceasing to precess and providing no signal. This excitation is done in the presence of some gradient labeled $G_i$ to indicate that the gradient can be in any desired direction; x, y, z or intermediate directions, depending on the slice desired. The waveform 71 represents the difference between a narrow pulse envelope, which excites the entire volume, and a sinc envelope, which excites a slice, thus rotating all spins, except for the slice, into the y axis. The gradient waveform is shown rectangular for simplicity, without any rephasing lobes. An alternative approach is shown in the bottom of FIG. 9. Here $B_1$ waveform 74 first rotates all of the magnetic moments into the y axis. This waveform can be applied to terminal 17 to excite coil 16. Alternatively it can be applied to terminal 13 to excite coil 11, following pulse 19, using appropriate switching. The following pulse 75 selectively rotates the section of interest, defined by $G_i$, into the x,z plane where only those moments will precess and produce signals. Another approach, not shown, is to use a saturation excitation in place of signal 71 which will selectively saturate all spins other than the section of interest. In all cases the imaging gradient sequence, not shown, will begin at time 72, or thereafter. Any of the previously described gradient imaging sequences can be used. In each case, however, two dimensions, in the plane of the selected section, will be used. This can be any two of the gradient dimensions shown in FIGS. 2 and 5-8. Because of the relatively low excitation frequency used, $\gamma B_Y$, heating will present no problem.

An alternative approach to the same slice selection problem is to control the rate of decay of pulse 19 so that it remains adiabatic, and use the constant or dashed line version of $B_Y$ waveform 24. In this case the magnetic moments will turn and point in the direction of $B_Y$ at the end of pulse 19. Here it is essential to use r.f. excitation to tip the magnetic moments in quadrature with the y axis where they will precess around the y axis. One approach is to excite only a selected slice, in which case pulse 71 will approximate a modulated sinc function, exciting solely the selected slice. This would be followed by a two-dimensional k space scan. Alternatively pulse 71 can be a sharp pulse, such as 74, exciting the entire volume. This would be followed by a three-dimensional scan of k space using any of the gradient waveforms shown.

If, as described, pulse 19 remains adiabatic and points in the y direction, the system can still operate without r.f. excitation. In this case $B_Y$ is turned off non-adiabatically, with sufficient rapidity that the magnetic moments continue to point in the y direction. Then a set of gradients pointed normal to the y axis cause the moments to precess. Thus gradients 12 would point in the x or z directions, rather than the y direction as shown in FIG. 1. As before, a constant field can be added to the gradient waveforms to place the image information on a convenient carrier.

The pulse 19, in FIG. 1, can require a high power pulser, especially in those cases where considerably high fields are desired. One efficient method of generating the pulse using resonant phenomena is shown in FIG. 10. Here capacitor 83 is charged between excitations. This can be done by connecting a resistor between d.c. supply 80 and capacitor 83 or alternatively, as shown, using a switch 81 which is actuated between excitations to recharge the capacitor to the supply voltage. When the pulse is desired switch 82 is thrown. This can be an SCR (silicon controlled rectifier) or other high power electronic switch. When 82 is closed, capacitor 83 and inductance L, representing pulsing coils 11, form a resonant circuit. Therefore a half sinusoid current pulse is generated in the coil 11 as the stored energy moves from the capacitor to the coil and back. When the current pulse reaches zero diode 84 automatically opens up, insuring that the current will not reverse. At some time following the pulse, switch 81 is closed to recharge capacitor 83. This half sinusoid has the advantage that it has its greatest slope, prior to turning off, which, as previously explained, is the desired behavior. Thus capacitor 83 is chosen to provide the desired pulse width, based on half of the reciprocal of the resonant frequency.

In some cases, even faster decay may be desired corresponding to the region of segment 23. In that case the circuit of FIG. 11 can be used. Here the general behavior is the same as previously described except for the addition of switch 85 and capacitor 86, C1. If switch 85 were always closed, the operation would be identical except the resonant frequency would be governed by C+C1. We use the circuit as previously described, with switch 85 closed, except we open 85 shortly before the pulse ends, corresponding to segment 23. At this point the resonant frequency is governed by C1, which is much lower than C, providing a very rapid decay. Following each pulse switch 85 is closed and the cycle repeated.

It should be emphasized that one of the most significant advantages of this invention is the immunity of the performance to spatial variations in the pulsed field. This is in sharp distinction to present systems which require homogenieties of the order of a few parts per million. Since the pulsed field is solely for polarization, and no resonance is involved, very large variations can be tolerated. This enables the construction of a much more efficient magnet where the coils 11 are closer to the object 10 than are used in present systems.

In the systems shown, following the gradient waveforms and the associated data acquisition, the residual magnetic moments in each voxel of the volume can be different. Therefore, the next polarizing pulse can result in a non-uniform moment distribution which can distort the resultant image. One solution to this problem is to make the time between pulses, $T_R$ in FIG. 1, long enough that the moments all decay to essentially zero. This can result in excessive imaging time for some studies. Another solution is that shown in FIG. 12, where the area of the gradient waveforms are made zero, so that the k-space returns to the origin, making the moment density uniform throughout the image. FIG. 12a and b are the readout and phase encoding waveforms from FIG. 8. Here they are modified to have zero area, to create uniform magnetic moments. FIG. 12a is a readout gradient waveform 90 where, following the k-space scan, the scan is returned to the origin. Similarly, the phase encoding waveforms in FIG. 12b have zero area. Waveform 91 provides the encoding to a specific line in k-space. Waveform 92 provides an equal and opposite area for each pulse in 91, returning the scan to the line through the k-space origin. Although equal amplitudes are shown, the amplitudes can be made different, with the widths changed correspondingly to provide zero area. In FIG. 12c the gradient system of FIG. 2 is shown in symmetric fashion with one waveform in 93 canceled by one of equal area in 94. The data could be collected solely during 93, with 94 used solely to line up the magnetic moments. For best SNR, however, it is desirable to collect data during the entire gradient readout interval. Thus when we retrace a portion of k-space, by reversing the gradient, we continue to collect data, and place the data in the appropriate slot in k-space. In FIG. 12b, the scan of k-space moves radially outward from the origin in 93, and radially back to the origin in 94. The SNR would increase by $\sqrt{2}$ if data is collected on both traverses.

With any zero area gradient waveform, the moments will all line up. If $B_Y$ is zero, using gradients only in the y direction, at the end of a zero area gradient sequence the residual magnetic moments will all be pointing in the z direction. This will provide a specific sensitivity to relaxation times since different materials will have different residual moments. The sensitivity to relaxation times can be altered by a number of factors. The time $T_R$ between pulses will alter the relaxation sensitivity. Also, the sensitivity can be changed by flipping the direction of the moments. This can be done using By pulse 95 in FIG. 12d. The gyromagnetic ratio $\gamma$ times the area $B_YT$ of the pulse determines the angular rotation. If this is made $\pi$, the sensitivity to relaxation times will be increased, because of the longer time required for the pulse to build up. If some other field, such as the earth's field, contributes to $B_Y$, the angle will change. Coils can be used to cancel the earth's field if desired. Otherwise the pulse are $B_YT$ of 95 in FIG. 12d can be altered to provide the desired angle. In the case where a carrier is used as with $B_Y$ signal 24 in FIG. 2, the angle will be determined by the total area of signal 24, following excitation. This can be carefully controlled so that $B_Y$ multiplied by the total duration is multiple of $2\pi$, plus the resultant desired angle.

As was indicated, vessel or flow imaging can be accomplished the same as with present systems using the subtraction of two sequences with differing flow moments. However, flow imaging can also be accomplished using approaches unique to this configuration. Since the polarizing or pulsed field is not involved in the receive operation, as contrasted with present systems, it can be used solely at the blood or flow supply region. Coils 11 can be relatively small and used in the portion of the anatomy which represents the source of blood. For example, if we wish to image the carotid arteries in the neck, coils 11 can be placed in the vicinity of the aortic root, the source of blood. The gradients 12 and receiver coil 16 are placed in the vicinity of the region being imaged, the carotid arteries. If care is taken that the pulsed field 11 does not polarize the static tissue in the vicinity of the carotid arteries, the resultant image will be solely the desrired vessels resulting from imaging the magnetic moments which have flowed to the carotid arteries. A projection image of this region will provide an arteriogram. Alternatively the same configuration can be used with a static magnetic field placed at the blood source, such as the aortic root. Thus coils 11 can be driven by a d.c. source, or a permanent magnet can be used in the same region. This effectively creates the desired pulse as the blood flows past the static field and gets polarized. Again, this static field should be confined to the source of blood and not be in the imaged region. This system can be used for imaging vessels or perfusion of tissue.

What is claimed is:

1. In a method for imaging an object using magnetic resonance without radio-frequency excitation the steps of:
    applying a magnetic pulse through the object producing a distribution of magnetic moments in a first direction;
    applying a plurality of orthogonal magnetic gradients through the object whose magnetic field points substantially normal to the first direction;
    receiving signals, following the magnetic pulse, resulting from the precessing magnetic moments in the object normal to the gradient field; and
    processing the received signals to form an image representing the magnetic moment distribution in the object.

2. The method as described in claim 1 where the step of applying the magnetic pulse includes the steps of:
    increasing the magnetic field from zero to a maximum value;
    decreasing the magnetic field from the maximum value down to a value substantially higher than the magnetic field orthogonal to the magnetic pulse field; and
    further decreasing the magnetic field at a rate greater than the adiabatic condition whereby the magnetic moments will remain pointing substantially in the direction of the pulsed field.

3. The method as described in claim 2 where the step of decreasing the magnetic field includes the step of decreasing the magnetic field from the maximum value to a value substantially higher than the magnetic field orthogonal to the magnetic pulse field at a rate which satisfies the adiabatic condition whereby the magnetic moments point to the resultant magnetic field.

4. The method as described in claim 1 where the step of applying a magnetic pulse includes the step of controlling the duration of the pulse to be a fraction of the $T_1$ relaxation time whereby the resultant received signals will be dependent on $T_1$.

5. The method as described in claim 1 where the step of applying a plurality of orthogonal magnetic gradients includes the step of starting at least one gradient before the magnetic pulse ends whereby the required gradient bandwidth is reduced.

6. The method as described in claim 1 including the step of adding a constant magnetic field in the same direction as the gradient field whose amplitude is greater than the strongest field due to the gradients whereby the resultant field substantially normal to the first direction will not change polarity.

7. The method as described in claim 1 where the step of applying gradients includes the step of applying three spatially orthogonal gradient fields and the step of repeating the entire sequence while varying the gradient fields so as to span the three dimensional spatial transform of the object.

8. The method as described in claim 1 where the step of applying gradients includes the step of applying two spatially orthogonal gradient fields and the step of repeating the entire sequence while varying the gradient fields so as to span the two dimensional spatial transform of a two-dimensional projection of the object.

9. The method as described in claim 1 where the step of applying spatially orthogonal gradients includes the step of applying an oscillating gradient to one spatial axis.

10. The method as described in claim 9 where the step of applying a magnetic pulse includes the step of terminating the pulse during a time interval where the oscillating gradient is substantially zero.

11. The method as described in claim 1 where the step of applying spatially orthogonal gradients includes the step of applying constant fields to two of the gradients whereby a radial line is traced in the k-space of the object of those two dimensions.

12. The method as described in claim 1 where the step of applying spatially orthogonal gradients includes the step of applying temporally orthogonal growing oscillatory waveforms to two of the gradients whereby a spiral is traced in the k-space of the object of those two dimensions.

13. The method as described in claim 1 where the step of applying spatially orthogonal gradients includes the step of applying waveforms which coarsely scan the k-space of the object and the step of applying gradient waveforms on subsequent scans which are interleaved with the first scan whereby all of k-space is covered in a plurality of scans.

14. The method as described in claim 1 where the step of applying a plurality of gradients includes the step of delaying the onset of the gradients following the magnetic pulse whereby the resultant image is dependent on the $T_2$ relaxation time.

15. The method as described in claim 1 where the step of applying a plurality of gradients includes the step of applying one gradient waveform which reaches its zero area time, or gradient echo time, delayed from the magnetic pulse whereby the resultant image is dependent on the $T_2$ relaxation time.

16. The method as described in claim 1 where the step of receiving signals includes the step of detecting the magnetic field resulting from the magnetic precessing moments in the object normal to the gradient field.

17. The method as described in claim 16 where the detecting step includes the step of detecting the derivative of the magnetic field using a coil whose axis is substantially normal to the axis of the precessing moments.

18. The method as described in claim 16 where the detecting step includes the step of detecting the magnetic field in two directions both normal to the gradient field and normal to each other.

19. The method as described in claim 1 where the step of applying gradients includes the step of applying gradient waveforms which have a net zero area whereby the magnetic moments will all be pointed in the same direction prior to the next pulse.

20. The method as described in claim 1 where the step of applying a magnetic pulse includes the steps of charging a capacitor and connecting the capacitor to a coil which produces the pulsed field as a half sinusoid.

21. The method as described in claim 20 including the step of reducing the capacitor size during the decaying portion of the pulse whereby the rate of decay is increased.

22. The method as described in claim 1 including the step of applying a constant magnetic field substantially normal to the direction of the pulsed field and the where the step of applying a magnetic pulse includes the step of adiabatically decreasing the magnetic field whereby the magnetic moments in the object point in the direction of the constant field and precess about the gradient field substantially normal to the constant field.

23. In a method for imaging an object using magnetic resonance the steps of:
   applying a magnetic pulse through the object in a first direction producing a distribution of magnetic moments pointed in the first direction;
   applying a second magnetic field, substantially smaller than the amplitude of the pulsed field, normal to the direction of the pulsed field causing the magnetic moments to precess normal to the second field;
   applying radio frequency excitation normal to the second field at a frequency substantially equal to the product of the gyromagnetic radio times the amplitude of the second field along with a magnetic gradient whose field points in the same direction as the second field whereby only a selected portion of the object has precessing magnetic moments;
   applying a plurality of orthogonal magnetic gradients through the object, following the radio frequency excitation, whose magnetic field points normal to the field of the magnetic pulse;
   receiving signals, following the radio frequency excitation, resulting from the precessing magnetic moments in the object normal to the gradient field; and
   processing the received signals to form an image representing the magnetic moment distribution in the object.

24. The method as described in claim 23 where the step of applying the radio frequency excitation along with the gradient includes the step of selectively removing the moments from all portions of the object except the selected portion.

25. The method as described in claim 23 where the step of applying the radio frequency excitation along with the gradient includes the step of rotating all of the magnetic moments in the object into the direction of the second field and selectively rotating the magnetic moments in the selected portion of the object normal to the second field whereby they precess and produce signals.

26. Apparatus for imaging an object using magnetic resonance without radio-frequency excitation comprising:
   means for applying a magnetic pulse through the object producing a distribution of magnetic moments in a first direction;
   means for applying a plurality of orthogonal magnetic gradients through the object whose magnetic field points substantially normal to the first direction;
   means for receiving signals, following the magnetic pulse, resulting from the precessing magnetic moments in the object normal to the gradient field; and means for processing the received signals to form an image representing the magnetic moment distribution in the object.

27. Apparatus as described in claim 26 where the means for applying the magnetic pulse includes:
means for increasing the magnetic field from zero to a maximum value;
means for decreasing the magnetic field from the maximum value down to a value substantially higher than the magnetic field orthogonal to the magnetic pulse field; and
means for furthur decreasing the magnetic field at a rate greater than the adiabatic condition whereby the magnetic moments will remain pointing substantially in the direction of the pulsed field.

28. Apparatus as described in claim 27 where the means for decreasing the magnetic field includes the means for decreasing the magnetic field from the maximum value to a value substantially higher than the magnetic field orthogonal to the magnetic pulse field at a rate which satisfies the adiabatic condition whereby the magnetic moments point to the resultant magnetic field.

29. Apparatus as described in claim 26 where the means for applying a magnetic pulse includes means for controlling the duration of the pulse to be a fraction of the $T_1$ relaxation time whereby the resultant received signals will be dependent on $T_1$.

30. Apparatus as described in claim 26 where the means for applying a plurality of orthogonal magnetic gradients includes means for starting at least one gradient before the magnetic pulse ends whereby the required gradient bandwidth is reduced.

31. Apparatus as described in claim 26 including means for adding a constant magnetic field in the same direction as the gradient field whose amplitude is greater than the strongest field due to the gradients whereby the resultant field normal to the pulsed field will not change polarity.

32. Apparatus as described in claim 26 where the means for applying gradients includes means for applying three spatially orthogonal gradient fields and means for repeating the entire sequence while varying the gradient fields so as to span the three dimensional spatial transform of the object.

33. Apparatus as described in claim 26 where the means for applying gradients includes means for applying two spatially orthogonal gradient fields and means for repeating the entire sequence while varying the gradient fields so as to span the two dimensional spatial transform of a two-dimensional projection of the object.

34. Apparatus as described in claim 26 where the means for applying spatially orthogonal gradients includes means for applying an oscillating gradient to one spatial axis.

35. Apparatus as described in claim 34 where the means for applying a magnetic pulse includes means for terminating the pulse during a time interval where the oscillating gradient is substantially zero.

36. Apparatus as described in claim 26 where the means for applying spatially orthogonal gradients includes means for applying constant fields to two of the gradients whereby a radial line is traced in the k-space of those two dimensions.

37. Apparatus as described in claim 26 where the means for applying spatially orthogonal gradients includes means for applying oscillatory increasing-amplitude temporally orthogonal waveforms to two of the gradients whereby a spiral is traced in the k-space of these two dimensions.

38. Apparatus as described in claim 26 where the means for applying spatially orthogonal gradients includes means for applying waveforms which coarsely scan k-space and means for applying waveforms on subsequent scans which are interleaved with the first scan whereby all of k-space is substantially covered in a plurality of scans.

39. Apparatus as described in claim 26 where the means for applying a plurality of gradients includes means for delaying the onset of the gradients following the magnetic pulse whereby the resultant image is dependent on the $T_2$ relaxation time.

40. Apparatus as described in claim 26 where the means for applying a plurality of gradients includes means for applying one gradient waveform which reaches its zero area time, or gradient echo time, delayed from the magnetic pulse whereby the resultant image is dependent on the $T_2$ relaxation time.

41. Apparatus as described in claim 26 where the means for receiving signals includes means for detecting the magnetic field resulting from the precessing magnetic moments in the object normal to the gradient field.

42. Apparatus as described in claim 41 where the detecting means includes means for detecting the derivative of the magnetic field using a coil whose axis is substantially normal to the axis of the precessing moments.

43. Apparatus as described in claim 41 where the detecting means includes the means for detecting the magnetic field in two directions both substantially normal to the gradient field and substantially normal to each other.

44. Apparatus as described in claim 26 where the means for applying gradients includes means for applying gradient waveforms which have a net zero area whereby the magnetic moments will all be pointed in the same direction prior to the application of the next magnetic pulse.

45. Apparatus as described in claim 44 including means for applying a magnetic pulse in the direction of the gradient field whereby the direction of the magnetic moments is altered.

46. Apparatus as described in claim 26 where the means for applying a magnetic pulse includes means for charging a capacitor and connecting the capacitor to a coil which produces the pulsed field as a half sinusoid.

47. Apparatus as described in claim 46 including the means for reducing the capacitor size during the decaying portion of the pulse whereby the rate of decay is increased.

48. Apparatus as described in claim 26 including means for applying a constant magnetic field substantially normal to the direction of the pulsed field and where the means for applying a pulsed magnetic field includes means for adiabatically decreasing the field amplitude whereby the magnetic moments will point in the direction of the constant field and precess about the gradient field substantially normal to the constant field.

49. Apparatus for imaging an object using magnetic resonance comprising:
means for applying a magnetic pulse through the object in a first direction producing a distribution of magnetic moments pointing in the first direction;
means for applying a second magnetic field, substantially smaller than the amplitude of the pulsed field, normal to the direction of the pulsed field causing the magnetic moments to precess normal to the second field;

means for applying radio frequency excitation normal to the second field at a frequency substantially equal to the product of the gyromagnetic ratio times the amplitude of the second field along with a magnetic gradient whose field points in the same direction as the second field whereby only a selected portion of the object has precessing magnetic moments;

means for applying a plurality of orthogonal magnetic gradients through the object, following the radio frequency excitation, whose magnetic field points normal to the field of the magnetic pulse;

means for receiving signals, following the radio frequency excitation, resulting from the precessing magnetic moments in the object normal to the gradient field; and means for processing the received signals to form an image representing the magnetic moment distribution in the object.

50. Apparatus as described in claim 49 where the means for applying the radio frequency excitation along with the gradient includes means for selectively removing the moments from all portions of the object except the selected portion.

51. Apparatus as described in claim 49 where the means for applying the radio frequency excitation along with the gradient includes means for rotating all of the magnetic moments in the object into the direction of the second field and selectively rotating the magnetic moments in the selected portion of the object normal to the second field whereby they precess and produce signals.

52. In a method for imaging an object using magnetic resonance the steps of:

applying a magnetic pulse through the object in a first direction;

applying a smaller magnetic field normal to the first direction which is turned on prior to the end of the magnetic pulse;

controlling the rate of decay of the magnetic pulse so that the magnetic moments point in the direction of the smaller magnetic field at the end of the pulse;

applying radio frequency excitation normal to the smaller field at a frequency substantially equal to the product of the gyromagnetic ratio times the amplitude of the smaller field along with a magnetic gradient whose field points in the same direction as the smaller field whereby a selected portion of the object has precessing magnetic moments normal to the smaller field;

applying a plurality of orthogonal magnetic gradients through the object, following the radio frequency excitation, whose magnetic field points in the direction of the smaller field;

receiving signals, following the radio frequency excitation, resulting from the precessing magnetic moments in the object normal to the gradient field; and processing the received signals to form an image representing the magnetic moment distribution in the object.

53. Apparatus for imaging an object using magnetic resonance comprising:

means for applying a magnetic pulse through the object in a first direction;

means for applying a smaller magnetic field normal to the first direction which is turned on prior to the end of the magnetic pulse;

means for controlling the rate of decay of the magnetic pulse so that the magnetic moments point in the direction of the smaller magnetic field at the end of the pulse;

means for applying radio frequency excitation normal to the smaller field at a frequency substantially equal to the product of the gyromagnetic ratio times the amplitude of the smaller field along with a magnetic gradient whose field points in the same direction as the smaller field whereby a selected portion of the object has precessing magnetic moments normal to the smaller field;

means for applying a plurality of orthogonal magnetic gradients through the object, following the radio frequency excitation, whose magnetic field points in the direction of the smaller field;

means for receiving signals, following the radio frequency excitation, resulting from the precessing magnetic moments in the object normal to the gradient field; and means for processing the received signals to form an image representing the magnetic moment distribution in the object.

54. In a method for imaging flowing material in a selected portion of an object the steps of:

applying a pulsed magnetic field to a source of flowing material in the object to form magnetic moments;

applying a set of orthogonal gradients to the selected portion whose field is substantially normal to the magnetic gradients whereby the moments precess;

receiving signals from the precessing magnetic moments which have flowed from the source of flowing material to the selected portion of the object; and processing the received signals to form an image of the flowing material.

55. The method as described in claim 54 where the step of applying a pulsed magnetic field to a source of flowing material includes the step of applying a static magnetic field to the source of flowing material whereby the flowing material experiences a pulsed field.

* * * * *

UNITED STATES PATENT AND TRADEMARK OFFICE
CERTIFICATE OF CORRECTION

PATENT NO.   : 5,057,776

DATED        : Oct. 15, 1991

INVENTOR(S)  : Albert Macovski

It is certified that error appears in the above-identified patent and that said Letters Patent is hereby corrected as shown below:

In the drawings, Sheet 1, Fig. 1, reference "B" on coil 11 should read --13--. On Sheet 2, Fig. 3, reference numeral --32-- should be added to the box labeled INT without a reference numeral; the box labeled "INT" with reference numeral 28 should be labeled --DFT--; and the connection from box 28 to box 29 should be labeled with reference numeral --31--. On Sheet 3, Fig. 4, box 28 labeled "DTF" should be labeled --DFT--. On Sheet 6, Fig. 9, reference numeral 72 should point to the end of the waveform. Column 1, line 47, cancel "the" and insert --they--. Column 9, line 65, cancel "points" and insert --the moments point--. Column 10, line 69, after k-space insert --scan--. Column 12, line 1, cancel "desrired" and insert --desired--. Column 14, line 7, cancel --the--. Column 18, line 44, cancel "gradients" and insert -- moments--.

Signed and Sealed this

Sixth Day of September, 1994

*Attest:*

BRUCE LEHMAN

*Attesting Officer*              *Commissioner of Patents and Trademarks*